United States Patent
Guilbert (10) Patent No.: US 8,233,641 B2
(45) Date of Patent: Jul. 31, 2012

(54) METHOD AND TOPOLOGY TO SWITCH AN OUTPUT STAGE IN A CLASS AB AUDIO AMPLIFIER FOR WIRELESS APPLICATIONS

(75) Inventor: Pascal Guilbert, Auriol (FR)

(73) Assignee: Atmel Rousset S.A.S. (FR)

( * ) Notice: Subject to any disclaimer, the term of this patent is extended or adjusted under 35 U.S.C. 154(b) by 1330 days.

(21) Appl. No.: 11/109,410

(22) Filed: Apr. 19, 2005

(65) Prior Publication Data
US 2006/0159292 A1 Jul. 20, 2006

(30) Foreign Application Priority Data
Jan. 18, 2005 (FR) ...................................... 05 00506

(51) Int. Cl.
*H03F 21/00* (2006.01)

(52) U.S. Cl. ....... 381/120; 381/123; 381/150; 381/94.5; 330/51

(58) Field of Classification Search .................. 381/120, 381/123, 121, 150, 94.5, 94.1; 330/262, 330/118, 75, 51, 81, 265, 264, 263
See application file for complete search history.

(56) References Cited

U.S. PATENT DOCUMENTS

| | | | | |
|---|---|---|---|---|
| 3,462,698 A | * | 8/1969 | Charles, Jr. ................... | 330/273 |
| 3,920,903 A | * | 11/1975 | Beller ............................ | 434/185 |
| 4,808,943 A | * | 2/1989 | Hayakawa ...................... | 330/51 |
| 4,991,221 A | * | 2/1991 | Rush ............................. | 381/120 |
| 5,166,983 A | * | 11/1992 | Susak ............................ | 381/104 |
| 5,243,640 A | | 9/1993 | Hadley et al. .................... | 379/59 |
| 5,475,872 A | | 12/1995 | Sato | |
| 5,487,182 A | | 1/1996 | Hansson ......................... | 455/90 |
| 5,543,759 A | * | 8/1996 | Comeau et al. ................ | 330/282 |
| 5,668,494 A | * | 9/1997 | Nicollini et al. ............... | 327/416 |
| 5,862,238 A | * | 1/1999 | Agnew et al. .................. | 381/321 |
| 6,122,369 A | | 9/2000 | Hwang et al. | |
| 6,397,087 B1 | | 5/2002 | Kim et al. ....................... | 455/569 |
| 6,573,786 B2 | | 6/2003 | Lee et al. ......................... | 330/51 |
| 2002/0175729 A1 | * | 11/2002 | Cyrusian ....................... | 327/274 |
| 2004/0116159 A1 | | 6/2004 | Cheng | |
| 2004/0223624 A1 | | 11/2004 | Inagaki | |

FOREIGN PATENT DOCUMENTS

| | | |
|---|---|---|
| EP | 0695106 | 1/1996 |
| WO | WO-2006078378 A2 | 7/2006 |

OTHER PUBLICATIONS

"Application Serial No. 05854097.2, Communication and Supplementary European Search Report Mailed on Dec. 11, 2008", 6 pgs.
05854097.2, "European Application Serial No. 05854097.2, Office Action Mailed on Mar. 18, 2009", 2.
"International Application Serial No. PCT/US2005/045312, International Search Report mailed Sep. 18, 2006", 1 pg.
"Chinese Application Serial No. 200580046640.5, Office Action mailed May 6, 2010", 4 Pgs.
200580046640.5, "China Application No. 200580046640.5, Office Action mailed on Jun. 26, 2009", 5 pages.

* cited by examiner

*Primary Examiner* — Vivian Chin
*Assistant Examiner* — Con P Tran
(74) *Attorney, Agent, or Firm* — Fish & Richardson P.C.

(57) ABSTRACT

A circuit and method of switching an output of a single preamplifier to or from multiple amplifier output stages. The preamplifier output is switched between multiple audio amplifier output stages without degrading the performance of the output signal. A switching circuit selectively couples the preamplifier output to an amplifier output stage and also couples a feedback loop between the selected amplifier output stage and the preamplifier stage.

20 Claims, 5 Drawing Sheets

METHOD AND TOPOLOGY TO SWITCH AN OUTPUT STAGE IN A CLASS AB AUDIO AMPLIFIER FOR WIRELESS APPLICATIONS

TECHNICAL FIELD

The present invention relates to audio amplifier circuits for use in wireless telephone and handheld devices.

BACKGROUND

Many manufacturers of wireless cellular telephones and handheld devices support both handset and hands free functionality in their telephone products. An external plug-in earphone/microphone is commonly used with a portable cellular telephone. The wireless cellular telephone, to support both the handset speaker and the plug-in earphone, will typically include two independent amplifiers. Two amplifiers are typically required because the handset speaker and plug-in earphone must work independently and present different loads. For example, a handset speaker load may be 8 ohms and the earphone load may be 32 ohms.

In a normal operation of using an external plug-in earphone/microphone, the handset microphone and speaker are turned off when the external plug-in earphone/microphone is in use. Since the function of using a handset and using a plug-in earphone are used separately, one amplifier remains unused when the other amplifier is active. Generally, it is difficult to use only a single amplifier because both loads cannot be permanently connected in parallel. The loads must work independently; the use of an external switch between the amplifier outputs and load generates an degradation in audio quality or increased distortion occurs.

Figure 1:
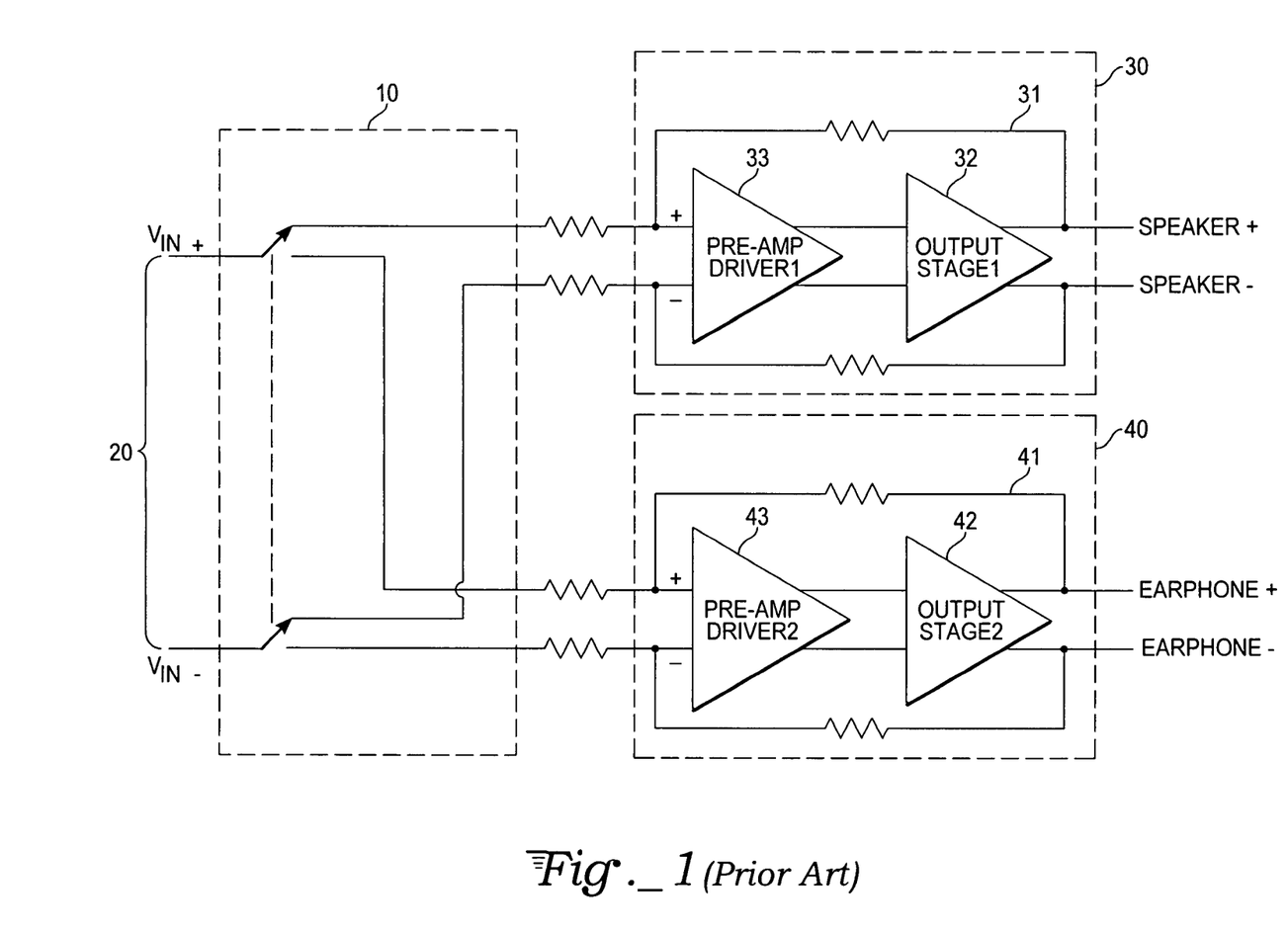
FIG. 1 is a block diagram of a prior art phone circuit having dual amplifiers.

FIG. 1 illustrates a typical prior art configuration of a switch selection circuit and amplifiers to support both a handset speaker and an external plug-in earphone. An selection switch 10 routes an audio input signal 20 to either a speaker amplifier circuit 30 or an earphone amplifier circuit 40. An amplifier circuit 30, 40 will typically include an output amplifier stage 32, 42 to drive the speaker or load and a preamplifier stage 33, 43. An amplifier circuit 30, 40 will typically include feedback loops 31, 41 to decrease distortion and improve the audio quality.

For example, in U.S. Pat. No. 6,397,087 to Kim et al. entitled "Device for Controlling the Connection of a Built-In Type Ear-Microphone for Portable Radio Terminal," an audio processing path connected to a speaker amplifier is switched to another independent amplifier to drive the hands free earpiece. However, Kim suffers from one or more of the following disadvantages: the use of two separate independent amplifiers, including a preamplifier and output amplifier for a handset speaker, and for a plug-in earphone which introduces redundancy in the wireless cellular telephone circuitry, additional cost, increased size and weight of the cellular telephone, and increased power consumption.

SUMMARY OF THE INVENTION

An exemplary embodiment of the present invention provides independently selectable audio amplifier output stages using only a single preamplifier stage (a single core amplifier or a single driver stage). The preamplifier output may be selectively coupled to one of multiple audio amplifier output stages without degrading the performance of the output signal. A switching circuit or switching method selectively couples the preamplifier output to a selected amplifier output stage and also couples a feedback signal between the selected amplifier output stage and the preamplifier stage. The coupling circuit or coupling method may couple the preamplifier stage to a selected output stage simultaneously with a feedback loop or employ a delay in the coupling method.

In one embodiment, a dedicated integrated circuit, an approximate reduction in the silicon die size of approximately 30 percent may be realized. The invention may be used in many types of communication devices and audio devices.

Other advantages of the present invention includes an elimination of redundant preamplifier or driver circuitry, decreasing the size and weight of a cellular telephone, and decreasing the overall power consumption.

DETAILED DESCRIPTION OF THE INVENTION

The present invention uses a single preamplifier (amplifier core or driver circuit) selectively coupled to one of multiple amplifier output stages. For example, a first output stage may drive an 8 ohm load and a second output stage may drive a 32 ohm load. A selection or switching circuit also couples or switches a feedback loop that corresponds to a selected output stage such that the overall performance of the amplifier is not degraded.

A typical application of the present invention is in a wireless device or a cellular telephone to amplify an audio signal and drive an audio transducer such as a speaker or earphone. However, as will be readily apparent to one skilled in the art, the invention may be applied to other product areas to amplify audio signals, other analog signals, or non-analog signals including carrier signals.

Figure 2:
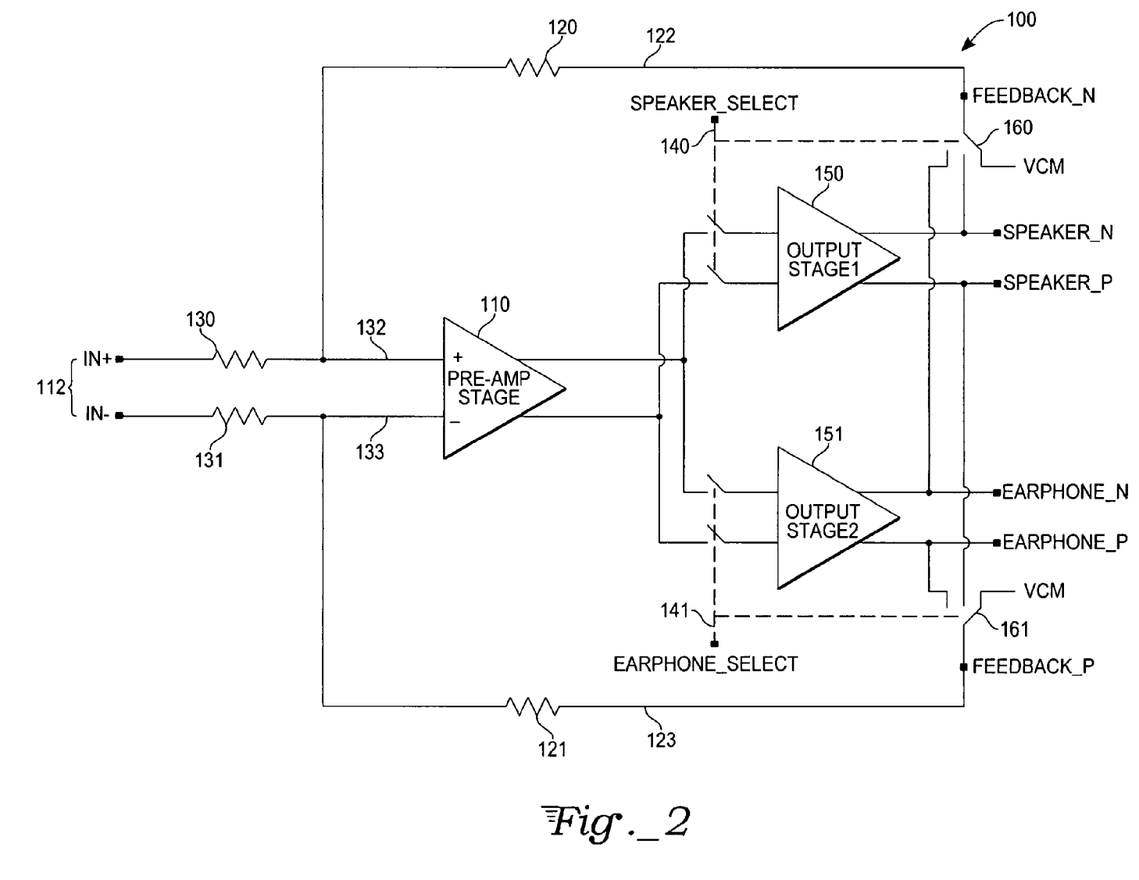
FIG. 2 is a block diagram of an exemplary circuit having a single core preamplifier or drive circuit.

Referring to FIG. 2, an exemplary audio amplifier circuit 100 includes a preamplifier 110 stage (amplifier core or driver circuit) having audio inputs 112, which may be differential inputs. Typically, the preamplifier 110 stage provides a voltage gain. However, the preamplifier 110 may include single or multiple amplification stages to, for example, amplify current and/or voltage. Typically, the audio inputs 112 are coupled to preamplifier inputs 132, 133 via input resistors 130, 131.

Feedback loops 122, 123 are coupled to the preamplifier inputs 132, 133 via feedback resistors 120, 121. In other embodiments the input resistors 130, 131 or the feedback resistors 120, 121 may be replaced by alternative circuitry depending upon the application. For example, the feedback loop may be used to provide a DC source or bias voltage to stabilize the circuitry, control drift or saturation, control an input or output impedance, reduce signal distortion, or control frequency and gain characteristics. Other circuits such as biasing circuits (for constant current sources) and common mode feedback (for a differential architecture) may be used.

When the input resistors 130, 131 ($R_{in}$) and feedback resistors 120, 121 ($R_{fb}$) are coupled in an inverting feedback design, the DC closed loop gain (G) of the preamplifier stage is given by the equation:

$$G = -\frac{R_{fb}}{R_{in}}$$

The exemplary audio amplifier circuit 100 also includes multiple amplifier output stages: output stage1 150, and output stage2 151 to drive loads such as a built-in speaker or an earphone. Each amplifier output stage 150, 151 may include single or multiple amplification stages to, for example, amplify current and/or voltage. Also, each output stage 150, 151 may be implemented as a balanced CMOS multiple stage class-AB amplifier.

Depending on the required load, a wide range of output stage devices and design architectures may be used. Although specifications such as linearity, total harmonic distortion, output offset, temperature drift, and output noise will improve, when a corresponding feedback loop 122, 123 is coupled to the preamplifier inputs 132, 133 via a feedback resistor 130, 131 or via an alternative circuit, it is generally desirable that the performance of preamplifier 110 stage is at least equal to or greater than the better performing output stage 150, 151. Also, for optimal operation of the audio amplifier as a whole, it is desirable that the preamplifier 110 stage is biased similar to the selected output stage 150, 151. For example, a similar biasing scheme for the preamplifier 110 stage and output stages 150, 151 promotes a fast start-up for a selected amplifier output stage 150, 151.

The output from the preamplifier 110 and the feedback loops 122, 123 are selectively coupled (or switched) to or from each output stage 150, 151. An exemplary switching method to connect the amplifier output stages 150, 151 is performed by speaker select switches 140 and by earphone select switches 141. The speaker and earphone select switches 140, 141 which may be implemented as a standard electromechanical switches or as a solid state switching devices such as CMOS transistors. When a solid state switching device is used, the switching method may operate as quickly as the solid state device allows, or may operate or couple the amplifier stages at a slower rate (ramp) to control the coupling speed. The switching method may connect the preamplifier 110 output to an output stage 150, 151 and disconnect the other output stage 150, 151, or the switching method may de-couple the preamplifier 110 output from all of the output stages 150, 151.

A switching method or procedure must be carefully implemented to reduce a possibility of oscillation or startup failure of the amplifier circuit 100. Switching the feedback loop 122, 123, may float the inputs to the preamplifier 110. Two switching devices 160, 161 may be used to bias the feedback sense point to a common mode voltage, $V_{CM}$ to simulate a connected output stage.

When one or both of the output stages 150, 151 are disconnected from the preamplifier 110 output, the output stage 150, 151 is typically muted to reduce the amplifier's overall power consumption. The unused output stage 150, 151 is then placed in a high impedance state. Most of the current consumption of the amplifier is related to the amplifier output stages 150, 151. Therefore, when no output stages 150, 151 are coupled to the preamplifier 110 output and the output stages 150, 151 are operating in mute mode, power and current consumption of the amplifier may be reduced up to 80 percent.

Figure 3:
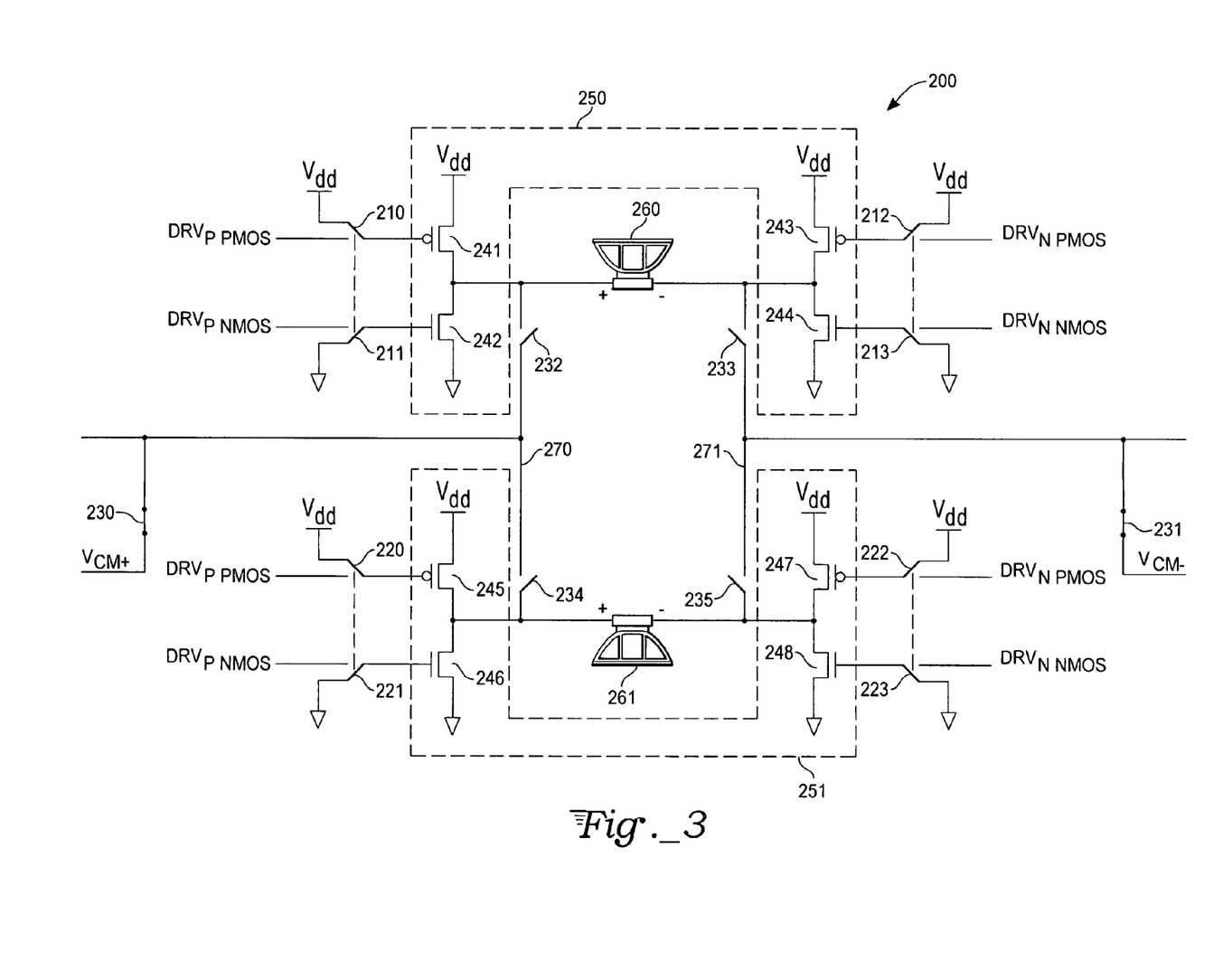
FIG. 3 is a circuit diagram of exemplary amplifier output stages and selection devices of FIG. 2

Referring to FIG. 3, exemplary H-Bridge circuit configurations 200 are illustrated, using MOS transistors 241-244 for a first output stage 250 to drive a handset speaker 260, and using MOS transistors 245-248 for a second output stage 251 to drive an earphone speaker 261. The handset speaker 260 and the earphone speaker 261 may have different impedances, for example an 8 ohm handset speaker and a 32 ohm earphone speaker. The first 250 and second 251 output stages include two PMOS transistors each 241, 243, 245, 247 and two NMOS transistors each 242, 244, 246, 248 connected in a rail-to-rail push-pull topology. Both output stages are biased in class-AB to minimize distortion and reduce power consumption In the first output stage 250 driving the handset speaker 260, the MOS transistor 241-244 gates are coupled to drive signals by selection devices (or switches) 210-213. In the second output stage 251 driving the earphone speaker 261, the MOS transistor 245-248 gates are coupled to drive signals by selection devices (or switches) 220-223. The selection devices 210-213, 220-223 couple or decouple (connect, disconnect, or switch) the first output stage 250 or the second output stage 251 to or from the preamplifier stage 110 (as shown in FIG. 2). The selection devices 210-213, 220-223 may also be used to place the MOS transistors 241-244, 245-248 in a high impedance state, for example to reduce power consumption, by coupling the MOS transistor 241-244, 245-248 gates to a pre-selected voltage or bias source (such as connecting to $V_{dd}$ or to ground).

An output stage 150, 151 is connected to a preamplifier stage via drive lines $DRV_{P\_PMOS}$, $DRV_{P\_NMOS}$, $DRV_{N\_PMOS}$, $DRV_{N\_NMOS}$. For illustrative purposes, the selection devices 210-213, 220-223 are shown such that neither the first output stage 250 nor the second output stage 251 are connected to the preamplifier stage 110. The selection devices 210-213, 220-223 are shown so that the first and second output stages 250, 251 are operating in a high impedance state with the gates of PMOS transistors 241, 243, 245, 247 are coupled to $V_{dd}$, and NMOS transistor 242, 244, 246, 248 coupled to ground. Operating all of the output stages in a high impedance state may be used to reduce the overall power consumption.

Several selection devices 230-235 selectively couple feedback signals to the preamplifier 110 stage via the feedback lines 270, 271. A Mute function is implemented by selection devices 230-231 to couple a common mode voltage ($V_{CM}+$ and $V_{CM}-$) to the preamplifier 110. Selection devices 232-235 are used to selectively couple a selected output stage signal, as a feedback signal, to the preamplifier 110 stage. For illustrative purposes, the selection devices 232-235 are shown open since neither the first nor the second output stages 250, 251 are coupled to the preamplifier stage 110 and a feedback loop from an output stage 250, 251 is not necessary. The Mute function selection devices 230-231 are normally closed when neither output stage is selected, presenting a common mode voltage to the preamplifier 110.

The selection devices (switches) are controlled by a selection circuit (described below) and may be implemented as mechanical-electrical switches or as other devices such as transistors. For example, a CMOS pass gate device may be used to implement each switch, or a transistor device operating in a linear or ramp mode may be used. In general, MOS pass gate devices operate in a highly non-linear manner. Selection devices 230, 231 are not critical since they do not couple an audio signal, and selection devices 210-213 and 220-223 are not critical since they couple the high impedance MOS transistor 241-244, 245-248 gates. However, selection devices 232-235 may feed an audio signal back to the preamplifier stage input and the selection devices 232-235 should be chosen so that their on-resistance is smaller than a feedback resistor or the impedance of other feedback circuitry, so the non-linearity of the selection devices 232-235 does not impact the overall performance of the amplifier.

Selection devices 210-213, 220-223, and 230-235 may be controlled to select and deselect an output stage to or from the preamplifier 110 (as shown in FIG. 2). A chronological or timed control sequence may be applied to the selection devices 210-213, 220-223, and 230-235 to reduce audible noise at the speaker, or to reduce a possibility of undesirable amplifier behavior such as oscillations or a failed start-up. An amplifier output stage is selected by coupling either the gates of the first output stage transistor 241-244 or the gates of the second output stage transistor 245-248 to the preamplifier output 110 by switching the output stage selection devices 210-213, 220-223. The mute selection devices 230-231 and feedback selection devices 232-235 are then switched after a timed delay from the selection of the output amplifier 250, 251.

Figure 4:
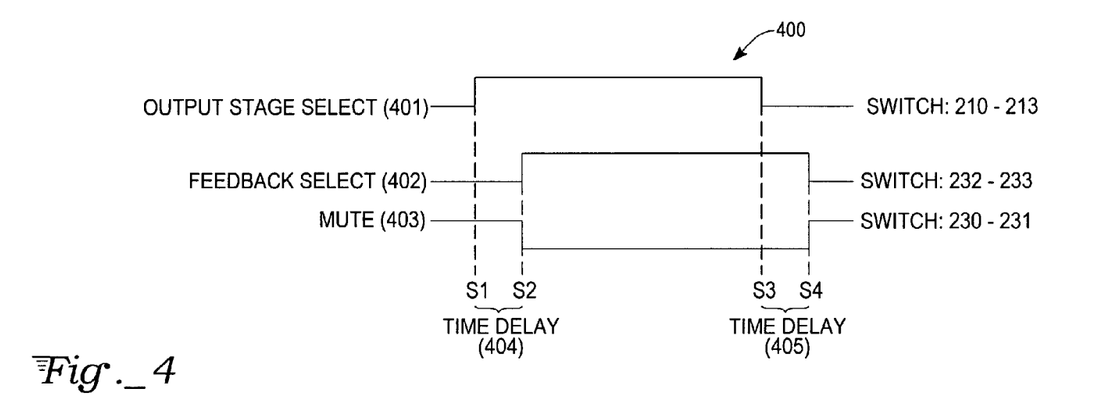
FIG. 4 is an exemplary control and timing diagram for controlling the circuit in FIG. 3.

Referring to FIG. 4, an exemplary timing sequence 400 illustrating the selection 401 of an amplifier output stage 250 (in FIG. 3) for the handset speaker 260 at time S1 by switching the select devices 210-213. The corresponding feedback loop for the selected amplifier output stage is then selected 402 from the selected output amplifier to the preamplifier after a time delay 404 has elapsed at S2. To facilitate a fast output stage switch, the time delay 404 may be approximately 5 nanoseconds. In addition, the mute select device 230 is switched off (opened) 403 at the same time that the feedback loop is selected 402 at S2, facilitating a continuous bias signal to the preamplifier to reduce the start up time for the preamplifier 110 and selected output stage.

With continued reference to FIG. 4, to deselect an output stage, the select devices 210-213 first deselect the currently coupled output stage from the preamplifier stage 110 by placing the MOS transistors 241-244 in a high impedance state so that no audible "pops" can be transmitted to the handset speaker 260 at time S3. The corresponding feedback loop is then deselected 402 after a time delay 405 has elapsed at time S4. The exemplary timing sequence may also be used to correspondingly select or deselect the output stage 251 for the earphone speaker.

Figure 5:
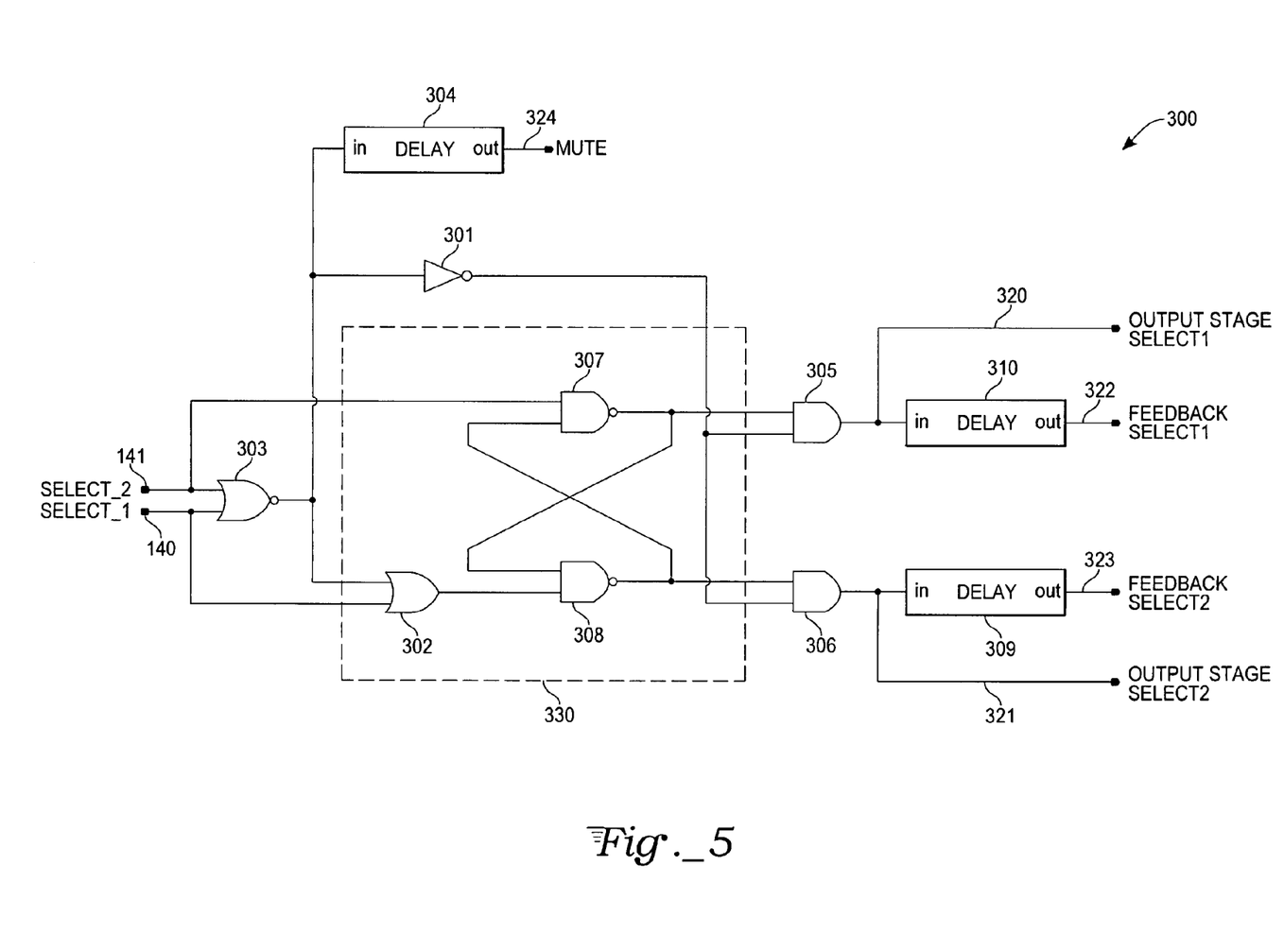
FIG. 5 is an exemplary digital control and timing circuit for controlling the circuit in FIG. 3.

Referring to FIG. 5, an exemplary digital selection circuit 300 includes input select lines 140, 141 to select a particular output stage, output stage select lines 320, 321 to select an output stage, feedback select lines 322, 323 to control feedback loops, and mute select lines 324. Operating modes of the digital selection circuit 300 depending upon the state of the input lines are shown in the table below. The outputs for controlling feedback loops 322, 323 and a mute circuit output 324 contain feedback delay circuits 309, 310, 304. The delay timing parameters for the mute delay 304 and feedback delays 309, 310 are generally matched, however, the delay times may be individually varied depending upon the application, for example, if the characteristics of a first output amplifier greatly differ from a second output amplifier.

| Select_1 | Select_2 | Mode |
|---|---|---|
| 0 | 0 | Mute (no output stages selected) |
| 0 | 1 | Select output stage 1 (earphone) |
| 1 | 0 | Select output stage 2 (handset speaker) |
| 1 | 1 | No change, hold the prior selection state |

When the two select lines Select_1 (140) and Select_2 (141) are set to OFF (low state), a mute mode is selected. The select lines 140, 141 are coupled to a NOR gate 303, setting the NOR gate 303 output to ON (high state). The NOR gate 303 output is coupled to the mute delay 304, and after a pre-determined delay period, the mute output 324 is set to ON. The NOR gate output is also coupled to an inverter 301, setting the inverter output to OFF. The inverter output is coupled to a pair of AND gates 305, 306 setting the outputs of both AND gates to OFF. The outputs of both AND gates are coupled to the output stage select lines 320, 321 and feedback delays 309, 310. The output stage select lines 320, 321 are set to OFF, and after a pre-determined delay period, the feedback select lines 322, 323 are set to OFF, deselecting all output stages.

When one of the two select lines Select_1 (140) or Select_2 (141) is then set to ON, the NOR gate 303 output is set to OFF and after a delay 304, the mute output 324 is set to OFF. The NOR gate 303 output is also coupled to a latch circuit 330 comprised of an OR gate 302, and two NAND gates 307, 308. The latch circuit 330 stores the last state when either of the input lines Select_1 (140) or Select_2 (141) is set to ON. The output of inverter 301 is set to ON, enabling the pair of AND gates 305, 306 to correspondingly select one of the output stage select lines 320, 321 and, after a delay, one of the corresponding feedback select lines 322, 323.

In a condition when a first select line of the two select lines (140 or 141) is set to ON, setting the second input line (141 or 140) to ON has no effect on the stored memory state of the latch circuit 330. This logic configuration has an advantage of preventing the simultaneous connection of both output stages and both feedback loops to the preamplifier stage. However, if after the second input line is set to ON, and the first input line is then set to OFF, the memory state of the latch 330 will change and the corresponding output stage will then be selected without turning the mute output 324 ON. This sequence allows a fast switch from one output stage to the other without enabling a mute mode.

Figure 6:
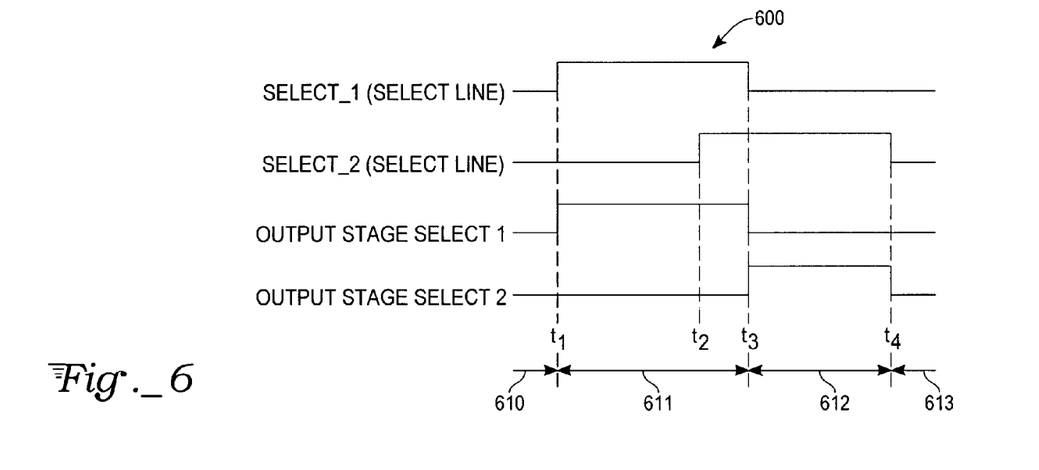
FIG. 6 is an alternate exemplary control and timing diagram for controlling the circuit in FIG. 3.

Referring to FIG. 6, an exemplary selection sequence 600 is illustrated. When the digital selection circuit 300 (FIG. 5) is in a mute mode 610 having no output stage selected, and the Select_1 select line (141 in FIG. 5) is set to ON at t1, the Select_1 output stage (and feedback loop) is selected. When the Select_2 select line (140 in FIG. 5) is set to ON at t2, only the Select_1 output stage (and feedback loop) will be selected for a first period 611. When the Select_1 select line 141 is then set to OFF at t3, and the Select_2 select line 140 is still set to ON, the selection circuit 300 will immediately select the Select_2 output stage (and feedback loop) during a second period 612. When the Select_2 select line 140 is then set to OFF at t4, and the Select_1 select line 141 is still set to OFF, the selection circuit 300 will operate in a mute mode during a third period 613.

Presented in this invention is a circuit and method of switching the output of a single preamplifier to or from multiple amplifier output stages. Those of skill in the art will recognize that the invention can be practiced with modification and alteration within the spirit and scope of the appended claims. Many other embodiments will also be apparent to those of skill in the art upon reading and understanding the above description. For example, a variety of amplifier output stage classes may be utilized. The description is thus to be regarded as illustrative instead of limiting. The scope of the invention should, therefore, be determined with reference to the appended claims, along with the full scope of equivalents to which said claims are entitled.

What is claimed is:

1. An amplifier comprising:
a plurality of amplifier output stages, including first and second amplifier output stages;
a single preamplifier stage; and
a selection circuit to couple an output of the single preamplifier to an input of a selected amplifier output stage of the plurality of output stages, and to couple a feedback loop from an output of the selected amplifier output stage to an input of the single preamplifier stage,
wherein the selection circuit is configured to:
deselect the first amplifier output stage by decoupling the first amplifier output stage from the single preamplifier stage and, after a first time delay, decoupling the feedback loop from the first amplifier output stage; and
after deselecting the first amplifier output stage, select the second amplifier output stage by coupling the second amplifier output stage to the single preamplifier stage and, after a second time delay, ramp coupling the feedback loop from the second amplifier output stage to the single preamplifier stage.

2. The amplifier of claim 1 wherein at least one amplifier output stage is configured to drive an audio transducer.

3. The amplifier of claim 1 wherein the selected feedback loop applies a bias voltage to the single preamplifier.

4. The amplifier of claim 1 wherein the selection circuit includes at least one transistor.

5. The amplifier of claim 1 wherein the selection circuit is configured to couple at least one voltage signal to at least one non-selected amplifier output stage to operate the at least one non-selected amplifier output stage in a low power state.

6. The amplifier of claim 1 wherein the selection circuit is configured to decouple the single preamplifier from all amplifier output stages.

7. The amplifier of claim 1, wherein the selection circuit is configured to couple the input of the single preamplifier stage to a bias voltage when an output stage is not selected.

8. An amplifier comprising:
a plurality of amplifier output stages, including first and second amplifier output stages;
a single preamplifier stage, the single preamplifier stage configured to drive the plurality of amplifier output stages; and
a plurality of MOS switches configured to couple an output of the single preamplifier stage to an input of a selected amplifier output stage of the plurality of output stages, the plurality of switches being further configured to couple a feedback loop from an output of the selected amplifier output stage to an input of the single preamplifier stage,
wherein the plurality of MOS switches is configured to:
deselect the first amplifier output stage by decoupling the first amplifier output stage from the single preamplifier stage and, after a first time delay, decoupling the feedback loop from the first amplifier output stage; and
after deselecting the first amplifier output stage select the second amplifier output stage by coupling the second amplifier output stage to the single preamplifier stage and, after a second time delay, ramp coupling the feedback loop from the second amplifier output stage to the single preamplifier stage.

9. The amplifier of claim 8 wherein at least one amplifier output stage is configured to drive an audio transducer.

10. The amplifier of claim 8 wherein the selected feedback loop applies a bias voltage to the single preamplifier.

11. The amplifier of claim 8 wherein at least one of the plurality of MOS switches has an on-resistance that is smaller than an impedance of circuitry in the selected feedback loop.

12. The amplifier of claim 8 wherein the plurality of MOS switches couples at least one voltage signal to at least one non-selected amplifier output stage to operate the at least one non-selected amplifier output stage in a low power state.

13. The amplifier of claim 8 wherein the plurality of MOS switches decouples the single preamplifier from all amplifier output stages.

14. The amplifier of claim 8, including a mute switch configured to couple the input of the single preamplifier stage to a bias voltage when an output stage is not selected.

15. A method comprising:
coupling an output of a single preamplifier stage to an input of a first amplifier output stage of a plurality of amplifier output stages and coupling a feedback loop from an output of the first amplifier output stage to an input of the single preamplifier stage;
deselecting the first amplifier output stage including decoupling the first amplifier output stage from the single preamplifier stage and, after a first time delay, decoupling the feedback loop from the first amplifier output stage; and
after deselecting the first amplifier output stage, selecting a second amplifier output stage including coupling the second amplifier output stage to the single preamplifier stage and, after a second time delay, ramp coupling the feedback loop from the second amplifier output stage to the single preamplifier stage.

16. The method of claim 15 further comprising driving an audio transducer with the selected amplifier output stage.

17. The method of claim 15 further comprising applying a bias voltage to the preamplifier stage.

18. The method of claim 15 further comprising coupling at least one voltage signal to at least one non-selected amplifier output stage to operate the at least one non-selected amplifier output stage in a low power state.

19. The method of claim 15 further comprising decoupling the preamplifier from all amplifier output stages and decoupling the preamplifier from all feedback loops.

20. The method of claim 15, including coupling the input of the preamplifier to a bias voltage when an output stage is not selected.

* * * * *

UNITED STATES PATENT AND TRADEMARK OFFICE
CERTIFICATE OF CORRECTION

PATENT NO. : 8,233,641 B2  Page 1 of 1
APPLICATION NO. : 11/109410
DATED : July 31, 2012
INVENTOR(S) : Pascal Guilbert It is certified that error appears in the above-identified patent and that said Letters Patent is hereby corrected as shown below:

Column 2, Line 7, delete "invention-may" and insert -- invention may --

Column 2, Line 23, after "FIG. 2" insert -- . --

Column 3, Line 41, delete "electromechanical" and insert -- electro-mechanical --

Column 4, Lines 12-13, delete "consumption" and insert -- consumption. --

Column 4, Lines 13-27, delete "In the first output stage . . . or to ground)." and insert the same as a new paragraph.

Column 8, Line 4, in Claim 8, delete "stage select" and insert -- stage, select --

Signed and Sealed this
Twenty-fifth Day of September, 2012

David J. Kappos
*Director of the United States Patent and Trademark Office*